United States Patent
Mo et al.

(10) Patent No.: US 9,263,276 B2
(45) Date of Patent: Feb. 16, 2016

(54) HIGH-K/METAL GATE TRANSISTOR WITH L-SHAPED GATE ENCAPSULATION LAYER

(75) Inventors: Renee T. Mo, Briarcliff Manor, NY (US); Wesley C. Natzle, New Paltz, NY (US); Vijay Narayanan, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 12/551,292

(22) Filed: Nov. 18, 2009

(65) Prior Publication Data
US 2011/0115032 A1 May 19, 2011

(51) Int. Cl.
| | |
|---|---|
| *H01L 29/78* | (2006.01) |
| *H01L 21/28* | (2006.01) |
| *H01L 29/49* | (2006.01) |
| *H01L 29/51* | (2006.01) |
| *H01L 29/66* | (2006.01) |

(52) U.S. Cl.
CPC ...... *H01L 21/28088* (2013.01); *H01L 29/4966* (2013.01); *H01L 29/517* (2013.01); *H01L 29/6659* (2013.01); *H01L 29/7833* (2013.01)

(58) Field of Classification Search
CPC ............ H01L 29/6659; H01L 29/6656; H01L 29/7833; H01L 21/823468
USPC .................. 257/369, 408; 438/287, 510, 595
See application file for complete search history.

(56) References Cited

U.S. PATENT DOCUMENTS

| | | | |
|---|---|---|---|
| 5,258,645 A * | 11/1993 | Sato ............................... | 257/637 |
| 5,736,446 A | 4/1998 | Wu | |
| 5,783,475 A | 7/1998 | Ramaswami | |
| 6,004,852 A * | 12/1999 | Yeh et al. ...................... | 438/303 |
| 6,030,876 A | 2/2000 | Koike | |
| 6,300,208 B1 | 10/2001 | Talwar et al. | |
| 6,323,519 B1 | 11/2001 | Gardner et al. | |
| 6,469,350 B1 | 10/2002 | Clark, Jr. et al. | |
| 6,693,013 B2 | 2/2004 | Bae et al. | |

(Continued)

FOREIGN PATENT DOCUMENTS

WO WO2009053327 A1 4/2009

OTHER PUBLICATIONS

International Search Report and Written Opinion, dated Mar. 25, 2011 for PCT/EP2010/062109.

(Continued)

*Primary Examiner* — David Vu
(74) *Attorney, Agent, or Firm* — Fleit Gibbons Gutman Bongini & Bianco PL; Thomas Grzesik

(57) ABSTRACT

A transistor is provided that includes a silicon layer with a source region and a drain region, a gate stack disposed on the silicon layer between the source region and the drain region, an L shaped gate encapsulation layer disposed on sidewalls of the gate stack, and a spacer disposed above the horizontal portion of the gate encapsulation layer and adjacent to the vertical portion of the gate encapsulation layer. The gate stack has a first layer of high dielectric constant material, a second layer comprising a metal or metal alloy, and a third layer comprising silicon or polysilicon. The gate encapsulation layer has a vertical portion covering the sidewalls of the first, second, and third layers of the gate stack and a horizontal portion covering a portion of the silicon layer that is adjacent to the gate stack.

20 Claims, 3 Drawing Sheets

(56) References Cited

U.S. PATENT DOCUMENTS

| | | | |
|---|---|---|---|
| 7,229,869 B2 * | 6/2007 | Yoon et al. | 438/197 |
| 7,495,280 B2 * | 2/2009 | Lo | 257/314 |
| 7,495,290 B2 * | 2/2009 | Li | 257/369 |
| 7,554,833 B2 * | 6/2009 | Hashimoto | 365/149 |
| 8,004,044 B2 | 8/2011 | Ogawa et al. | |
| 8,034,678 B2 * | 10/2011 | Kobayashi | 438/199 |
| 2004/0033678 A1 | 2/2004 | Arghavani et al. | |
| 2006/0154425 A1 | 7/2006 | Yang et al. | |
| 2006/0157750 A1 * | 7/2006 | Kim et al. | 257/288 |
| 2008/0014730 A1 | 1/2008 | Arghavani et al. | |
| 2008/0017936 A1 * | 1/2008 | Buchanan et al. | 257/411 |
| 2008/0258227 A1 * | 10/2008 | Wang et al. | 257/369 |
| 2011/0049567 A1 | 3/2011 | Peng et al. | |

OTHER PUBLICATIONS

Non Final Rejection dated Mar. 7, 2013 for U.S. Appl. No. 13/571,977.

Final Rejection dated Jun. 6, 2013 for U.S. Appl. No. 13/571,977.

Non-Final Office Action dated Jul. 8, 2014 for U.S. Appl. No. 13/571,977.

Final Rejection dated Dec. 10, 2014 received for U.S. Appl. No. 13/571,977.

Non-Final Office Action Dated Jun. 2, 2015, received for U.S. Appl. No. 13/571,977.

* cited by examiner

HIGH-K/METAL GATE TRANSISTOR WITH L-SHAPED GATE ENCAPSULATION LAYER

FIELD OF THE INVENTION

The present invention generally relates to the field of semiconductors, and more particularly relates to high-K dielectric and metal gate transistors.

BACKGROUND OF THE INVENTION

High dielectric constant (high-K) transistors in conjunction with metal gates, or "MHK transistors", are undergoing active development in the industry. In an MHK transistor, any extrinsic oxygen that enters the formed high-k gate layer during subsequent processing changes the electrical properties of the MHK transistor. One of the more deleterious impacts of extrinsic oxygen is the lower K interfacial oxide (SiOx) regrowth underneath the high-K layer. It is critical to prevent such dielectric regrowth in order to achieve the desired dielectric thickness and maintain good short channel control. A conventional MHK transistor, such as the one disclosed in U.S. Patent Application Publication No. 2004/033678, uses an I-shaped gate encapsulation layer to protect the high-k gate layer from such dielectric regrowth. While this protects the high-k gate layer, one observed problem with such a transistor is that an I-shaped gate encapsulation layer often leads to the high-k/metal gate layer being exposed, so as to leave it open to attack during subsequent wet etching with the possibility of extrinsic oxygen ingress.

When the metal high-k gate stack is not perfectly vertical but instead has a sloped profile, the I-shaped gate encapsulation layer does not sufficiently protect the metal layer of the gate stack. This leaves the metal gate layer exposed and open to oxygen ingress and attack during subsequent wet etches In particular, the edge of the metal gate layer is exposed so that metal is etched out. As a result of the gate being undercut, the electrical properties of the metal high-k transistor are changed. Further, in many cases the gate is undercut to such an extent that the gate stack lifts off and is then re-deposited elsewhere on the integrated circuit wafer. Thus, the use of an I-shaped gate encapsulation layer to protect the gate stack results in poor yield and a process that is not robust.

SUMMARY OF THE INVENTION

One embodiment of the present invention provides a transistor that includes a silicon layer with a source region and a drain region, a gate stack disposed on the silicon layer between the source region and the drain region, an L shaped gate encapsulation layer disposed on sidewalls of the gate stack, and a spacer disposed above the horizontal portion of the gate encapsulation layer and adjacent to the vertical portion of the gate encapsulation layer. The gate stack has a first layer of high dielectric constant material, a second layer comprising a metal or metal alloy, and a third layer comprising silicon or polysilicon. The gate encapsulation layer has a vertical portion covering the sidewalls of the first, second, and third layers of the gate stack and a horizontal portion covering a portion of the silicon layer that is adjacent to the gate stack.

Another embodiment of the present invention provides a method for fabricating a transistor. According to the method, a first layer is formed on a silicon layer, with the first layer being a high dielectric constant material. A second layer is formed on the first layer, with the second layer being a metal or metal alloy. A third layer is formed on the second layer, with the third layer being silicon or polysilicon. The first, second, and third layers are etched so as to form first, second, and third layers of a gate stack, and an encapsulation layer is deposited. A spacer is deposited above the horizontal portion of the gate encapsulation layer and adjacent to the vertical portion of the gate encapsulation layer; and the spacer is etched so as to form an L shaped gate encapsulation layer disposed on sidewalls of the gate stack. The gate encapsulation layer has a vertical portion covering the sidewalls of the first, second, and third layers of the gate stack and a horizontal portion covering a portion of the silicon layer that is adjacent to the gate stack.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

FIGS. 1 to 5 illustrate a process for fabricating a metal high-k transistor with an L-shaped gate encapsulation layer according to one embodiment of the present invention. In these figures an NFET transistor and a PFET transistor are shown arranged in a side-by-side manner for convenience of description. However, this is not meant to limit the present invention. Embodiments of the present invention can be directed to one or more NFET transistors, one or more PFET transistors, or a combination of these two types of transistors.

Figure 1:
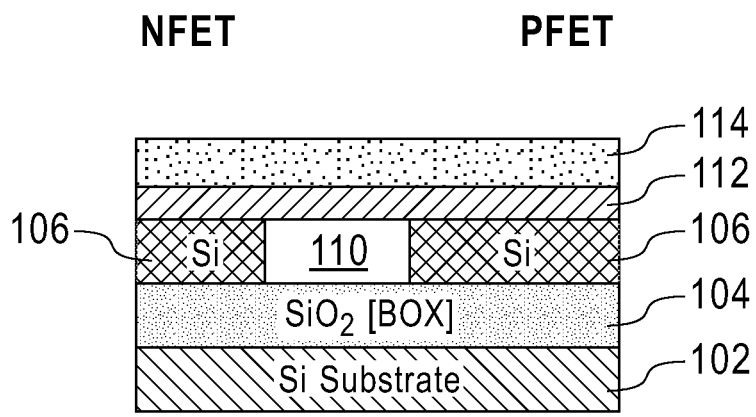
FIGS. 1 to 5 are cross-sectional views of a process for fabricating a metal high-k transistor with an L-shaped gate encapsulation layer according to one embodiment of the present invention.

The process of this embodiment begins with a silicon-on-insulator (SOI) wafer that has a silicon substrate 102, an overlying oxide layer ("BOX") 104 (e.g., of 3 μm), and an overlying silicon layer 106. One or more STI regions 110 are formed in the silicon layer 106. There is deposited a metal oxide or metal oxynitride dielectric layer whose dielectric constant (k) is greater than 3.9 to form a high-k dielectric layer 112 for the gate stack, as shown in FIG. 1. Exemplary materials for this high-k dielectric layer 112 are $HfO_2$, HfSiO, HfSiON, HfZrO, $TiO_2$, $La_2O_3$, $Y_2O_3$, $Al_2O_3$, and mixtures thereof. Preferably, the dielectric constant (k) of the high-k dielectric layer is between 18 and 40. In one embodiment, a hafnium dioxide ($HfO_2$) layer with a k value in the range of about 20-25 (as compared to 3.9 for $SiO_2$) is deposited with an exemplary thickness in the range of about 1-3 nm.

A metal layer is then deposited to form a metal layer 114 for the gate stack. Preferably, the metal layer 114 is formed of a thermally stable metal, such as TiN, TaN, TaC, TiAlN, TaAlN, or their derivatives. In one embodiment, a titanium nitride layer (TiN) is deposited with an exemplary thickness of about 1-10 nm, and preferably about 2-5 nm. The high-k dielectric layer 112 and metal layer 114 together form the (as yet unpatterned) MHK gate stack. This initial structure represents a conventional 501 CMOS with an MHK gate stack. In an alternative embodiment, a bulk silicon wafer is used in place of the SOI wafer.

Figure 2:
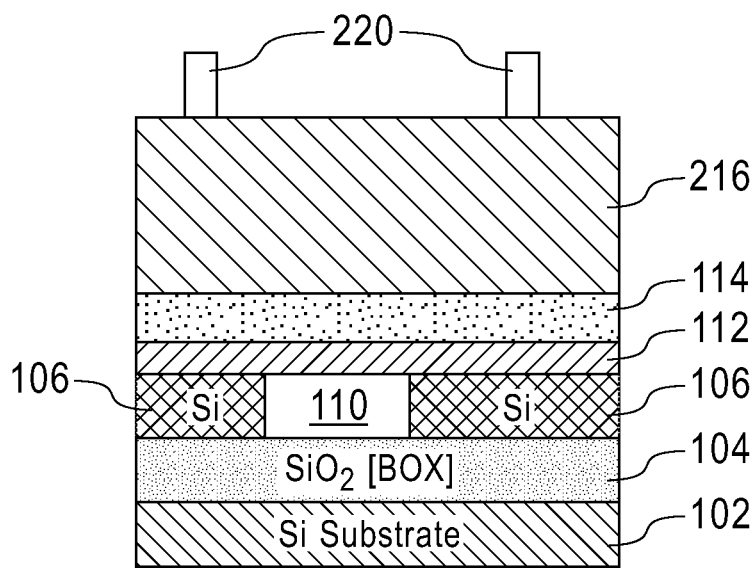

FIG. 2 shows the structure after the deposition of an amorphous silicon (or polysilicon) layer 216 having an exemplary thickness in the range of about 20-100 nm, and the subsequent deposition and patterning of a photoresist layer 220. The photoresist 220 is left where a device gate stack is desired to be formed. In alternative embodiments, layer 216 is formed of a conducting metal such as tungsten or aluminum.

Figure 3:
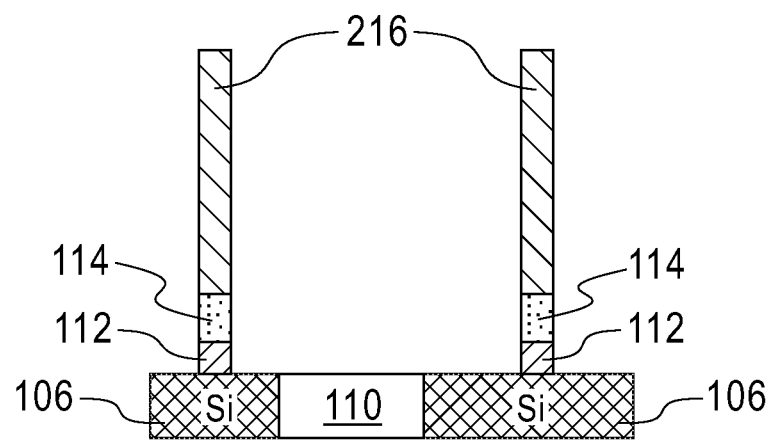

FIG. 3, which is a partial view that does not include the silicon substrate 102 and oxide layer 104 for simplicity, shows the result after a gate stack etch and subsequent removal of the photoresist 220. In this embodiment, the gate stack etch is performed in one step: a single etch that stops on the silicon layer 106. In an alternative embodiment, the gate stack is etched in two steps: a first etch of the metal layer 114 that stops at the high-k layer 112, and a second etch of the high-k layer 112 that stops at the silicon layer 106.

The resulting gate stack is formed by the high-k layer 112, the metal layer 114, and the silicon layer 216. In the gate stack of this embodiment, a lateral extent (width) of the high-k layer 112 is the same as a lateral extent (width) of the metal and silicon layers 114 and 216.

Figure 4:
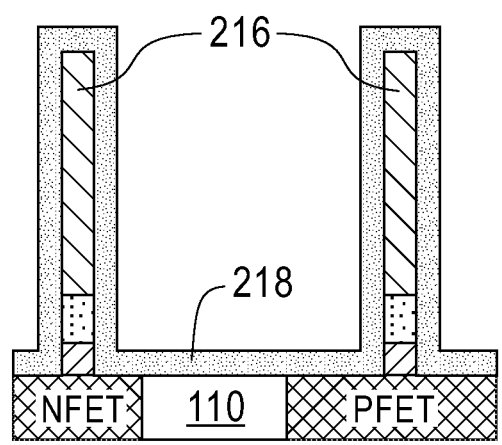

After the gate stack etch, nitride (e.g., SiN) is deposited to form a nitride layer 218, as shown in FIG. 4. This deposition is performed using a conformal deposition process so that the vertical portion of the nitride layer located on the side of the gate stack is substantially the same thickness as the horizontal portion of the nitride layer located on top of the silicon layer 106. Preferably, the nitride layer 218 is deposited using an extremely conformal deposition process so that the vertical portion of the nitride layer is the same thickness as the horizontal portion of the nitride layer. Exemplary deposition processes used in embodiments of the present invention include molecular layer deposition (MLD), atomic layer deposition (ALD), low-pressure chemical vapor deposition (LPCVD), and rapid thermal chemical vapor deposition (RTCVD).

Thus, the nitride layer 218 covers the exposed surfaces of the high-k layer 112, the metal layer 114, and the silicon layer 216 of the gate stack, and the silicon layer 106. In this embodiment, the nitride layer 218 is formed with an exemplary thickness in the range of about 10-20 nm. In another embodiment, the nitride layer 218 has an exemplary thickness of about 6-15 nm.

Figure 5:
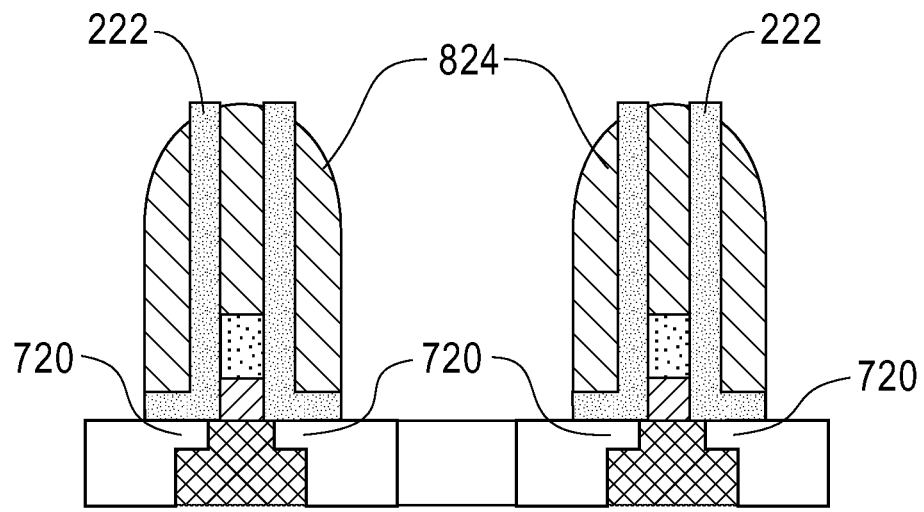

In one embodiment, oxide films are deposited (for example, by PECVD) and spacers 824 are then formed by reactive ion etching (RIE) so as to be above the horizontal portion of the gate encapsulation layer 218 and adjacent to the vertical portion of the gate encapsulation layer 218. In other words, each oxide spacer 824 extends from the vertical portion of its corresponding gate encapsulation layer 218 to the end of the horizontal portion of that gate encapsulation layer 218. The oxide spacers 824 of this embodiment have an exemplary thickness of about 2-10 nm. The RIE process for forming oxide spacers is used to form an L-shaped gate encapsulation layer 222, as shown in FIG. 5. The L-shaped gate encapsulation layer 222 has a vertical portion that remains on the sidewalls of the gate stack and a horizontal portion that remains on portions of the silicon layer 106 that are adjacent to the gate stack. This nitride gate encapsulation layer acts as an oxygen diffusion barrier and protects the metal gate layer from etching during subsequent processing.

The remainder of the fabrication process is a conventional CMOS fabrication process. In particular, extension implants 720 are alternately performed on the NFET and PFET transistors. In particular, photolithography is used to selectively define the areas for the source/drain extension implants for the NFET and PFET, and ions are implanted. The extension implant is performed using an n-type species for the NFET, and using a p-type species for the PFET.

The final spacer for the source/drain implant can be formed of an oxide or a nitride. The source/drain implant is performed using a p-type species for the NFET (for example, As or P), and using an n-type species for the PFET (for example, B or $BF_2$). A subsequent rapid thermal anneal (RTA) is performed (e.g., millisecond laser anneal or flash anneal) to provide relatively deep diffusions for the source and drain regions. Subsequent conventional processing is used to silicide the gates, sources, and drains (typically with Ni or Co) to complete the NFET and PFET transistors.

Figure 6:
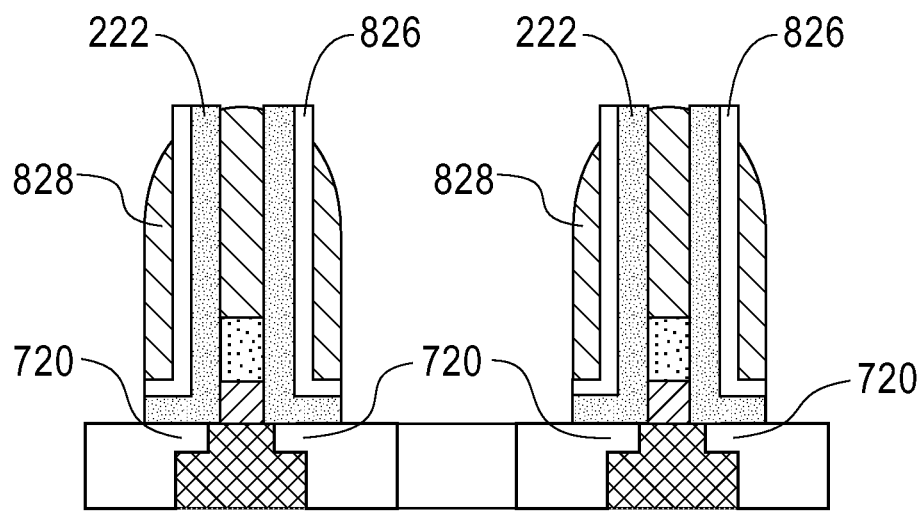
FIG. 6 is a cross-sectional view of a metal high-k transistor with an L-shaped gate encapsulation layer in accordance with another embodiment of the present invention.

FIG. 6 shows a metal high-k transistor with an L-shaped gate encapsulation layer in accordance with another embodiment of the present invention. In this embodiment, nitride spacers are used in place of the oxide spacers following formation of the gate encapsulation layer. More specifically, after the deposition of the nitride layer 218, an oxide (e.g., $SiO_2$) is deposited (for example, by PECVD) to form an oxide layer 826. In this embodiment, the nitride layer 218 is formed with an exemplary thickness in the range of about 5-20 nm. Nitride films are deposited (for example, by PECVD) and spacers 828 are then formed by RIE so as to be above the horizontal portion of the oxide layer 826 and adjacent to the vertical portion of the oxide layer 826. The nitride spacers 824 of this embodiment have an exemplary thickness of about 2-10 nm. Thus, in this embodiment, the L-shaped gate encapsulation layer 222 has a vertical portion that remains on the sidewalls of the gate stack and a horizontal portion that remains portions of the silicon layer 106 that are adjacent to the gate stack. An oxide layer 826 is provided between the gate encapsulation layer 222 and the nitride spacer 828 and acts as an etch stop layer and enables L-shaped encapsulation. Each nitride spacer 828 extends from the vertical portion of the corresponding oxide layer 826 to the end of the horizontal portion of that oxide layer 826, which is also the end of the horizontal portion of the underlying gate encapsulation layer 222. The remainder of the fabrication process is the same as in the embodiment described above.

Accordingly, embodiments of the present invention provide a MHK transistor having an L-shaped gate encapsulation layer. The L-shaped gate encapsulation layer prevents extrinsic oxygen from entering the high-k gate layer. Additionally, the L-shaped gate encapsulation layer prevents the metal gate layer from being attacked during etching when the gate stack is not perfectly vertical. In particular, the horizontal portion of the L-shaped gate encapsulation layer ensures that the edge of the metal gate layer is covered during etching. As a result, the gate is not undercut when the gate stack has a sloped profile. Thus, the electrical properties of the metal high-k transistor are not changed, while the process is more robust and a higher yield is obtained.

The embodiments of the present invention described above are meant to be illustrative of the principles of the present invention. These MHK device fabrication processes are compatible with CMOS semiconductor fabrication methodology, and thus various modifications and adaptations can be made by one of ordinary skill in the art. All such modifications still fall within the scope of the present invention.

For example, further embodiments can use other compatible materials for the high-k layer, such as HfSiO, HfSiON, HfZrO, $TiO_2$, $La_2O_3$, $Y_2O_3$, $Al_2O_3$, and mixtures thereof The metal-containing layer 114 could also be formed of another material, such as one or more of TiN, TaN, TaC, TiAlN, TaAlN, or their derivatives. Additionally, in further embodiments the silicon layer 216 described above can be comprised of another material that is able to be etched, remain conductive, and withstand high temperatures. Further, in some embodiments, a silicon germanium layer is deposited over silicon layer 106 for the PFET only. In one embodiment, this silicon germanium layer has a thickness of about 5-10 nm and is about 20%-40% germanium. Likewise, while the illustrated embodiment described above relates to transistors on an SOI wafer, the transistors and fabrication methods of the present invention are also applicable to bulk technologies. Also, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A method for fabricating a transistor, the method comprising:

providing a silicon layer above a substrate, the silicon layer being separated from the substrate by one or more layers;

forming a first layer on and in contact with the silicon layer, the first layer comprising a high dielectric constant material;

forming a second layer and in contact with the first layer, the second layer comprising a metal or metal alloy;

forming a third layer on the second layer, the third layer comprising silicon or polysilicon;

etching the first, second, and third layers so as to form first, second, and third layers of a gate stack;

depositing an encapsulation layer, the encapsulation layer including a horizontal portion in contact with the silicon layer and a vertical portion that is located on and in contact with sidewalls of the gate stack;

after depositing the encapsulation layer, depositing one spacer layer above and in contact with the horizontal portion of the encapsulation layer and adjacent to and in contact with the vertical portion of the encapsulation layer, wherein depositing the one spacer layer comprises depositing a first spacer layer above the horizontal portion of the encapsulation layer and adjacent to the vertical portion of the encapsulation layer, and after depositing the first spacer layer, depositing a second spacer layer;

after depositing the spacer layer, etching the encapsulation layer and the one spacer layer so as to form a spacer and an L-shaped gate encapsulation layer that is disposed on the sidewalls of the gate stack, the L-shaped gate encapsulation layer comprising a vertical portion covering and in contact with the sidewalls of the first, second, and third layers of the gate stack and a horizontal portion covering and in contact with a portion of the silicon layer that is adjacent to the gate stack, and the spacer being above and in contact with the horizontal portion of the L-shaped gate encapsulation layer and adjacent to and in contact with the vertical portion of the L-shaped gate encapsulation layer, the spacer extending from the vertical portion of the L-shaped gate encapsulation layer to the horizontal portion of the L-shaped gate encapsulation layer, the spacer comprising a vertical sidewall extending from a surface of the horizontal portion of the L-shaped gate encapsulation layer to a height above at least the second layer comprising the metal or metal alloy, wherein etching the encapsulation layer and the at least one spacer layer further comprises etching the first spacer layer and the second spacer layer so as to form the spacer, the spacer further comprising:

an L-shaped spacer layer that includes a vertical portion covering sidewalls of the vertical portion of the L-shaped gate encapsulation layer, and a horizontal portion covering the horizontal portion of the L-shaped gate encapsulation layer, where the L-shaped spacer layer is formed with a thickness that is less than a thickness of the L-shaped gate encapsulation layer; and the second spacer layer disposed on sidewalls of the vertical portion of the L-shaped oxide layer and above the horizontal portion of the L-shaped oxide layer, wherein the L-shaped gate encapsulation layer, the L-shaped spacer layer, and the second spacer layer are formed with a combined width that is greater than a width of the gate stack;

after etching the encapsulation layer and the one spacer layer, performing an extension implantation to implant ions so as to form source/drain extensions in the silicon layer, the source/drain extensions not underlying the gate stack; and after performing the extension implantation, performing a source/drain implantation and performing an anneal to implant and diffuse ions for source and drain regions in the silicon layer, wherein the extension implantation and the source/drain implantation are two separate implantations, and both the extension implantation and the source/drain implantation are performed after etching the encapsulation layer and the one spacer layer and while the spacer is present above the horizontal portion of the L-shaped gate encapsulation layer and adjacent to the vertical portion of the L-shaped gate encapsulation layer.

2. The method of claim 1, wherein a thickness of the L-shaped gate encapsulation layer is less than a thickness of the first layer of the gate stack.

3. The method of claim 1, wherein a thickness of the vertical portion of the L-shaped gate encapsulation layer is substantially equal to a thickness of the horizontal portion of the L-shaped gate encapsulation layer.

4. The method of claim 1, wherein depositing the encapsulation layer comprises performing molecular layer deposition (MLD), atomic layer deposition (ALD), low-pressure chemical vapor deposition (LPCVD), or rapid thermal chemical vapor deposition (RTCVD) to deposit a layer of nitride.

5. The method of claim 1, wherein the first spacer layer is an oxide layer, and where the second spacer layer is a nitride layer.

6. The method of claim 1, wherein the horizontal portion of the L-shaped gate encapsulation layer directly contacts the silicon layer.

7. The method of claim 1, wherein depositing an encapsulation layer is performed after etching the first, second, and third layers.

8. The method of claim 1, wherein portions of the source and drain regions underlie the spacer.

9. The method of claim 1, wherein etching the first, second, and third layers comprises performing a single etch that etches the first, second, and third layers and stops on the silicon layer, so as to form the gate stack in the single etch.

10. The method of claim 1, wherein the L-shaped gate encapsulation layer consists of a single layer.

11. The method of claim 1,
wherein the L-shaped gate encapsulation layer consists of a single encapsulation layer, the spacer consists of a single spacer layer, and
the single spacer layer of the spacer directly contacts the single encapsulation layer of the L-shaped gate encapsulation layer.

12. The method of claim 1,
wherein
the first spacer layer consists of SiO2.

13. The method of claim 1,
wherein
the first spacer layer does not comprise a high dielectric constant material and the second spacer layer comprises a nitride layer.

14. A non-transitory computer readable storage medium encoded with a program for fabricating a nFET transistor and a pFET transistor, the program comprising instructions for performing:

providing a buried oxide layer on and in contact with a single substrate, where the single substrate comprises an nFET region and a pFET region;

providing a silicon layer on and in contact with the buried oxide layer, the silicon layer being provided across both the nFET and pFET regions of the substrate;

depositing a silicon germanium layer on and in contact with the silicon layer;

forming a first layer on and in contact with the silicon germanium layer, the first layer comprising a high dielectric constant material, the first layer being provided across both the nFET and pFET regions of the substrate;

forming a second layer on and in contact with the first layer, the second layer comprising a metal or metal alloy and being provided across both the nFET and pFET regions of the substrate;

forming a third layer on the second layer, the third layer comprising silicon or polysilicon and being provided across both the nFET and pFET regions of the substrate;

etching the first, second, and third layers so as to form first, second, and third layers of a first gate stack in the nFET region and first, second, and third layers of a second gate stack in the pFET region;

depositing a nitride encapsulation layer, the nitride encapsulation layer including a horizontal portion in contact with the silicon layer and a vertical portion that is located on and in contact with sidewalls of the first and second gate stacks;

after depositing the nitride encapsulation layer, depositing at least one spacer layer above and in contact with the horizontal portion of the nitride encapsulation layer and adjacent to and in contact with the vertical portion of the nitride encapsulation layer, wherein depositing the one spacer layer comprises
depositing a first spacer layer above the horizontal portion of the encapsulation layer and adjacent to the vertical portion of the encapsulation layer, and
after depositing the first spacer layer, depositing a second spacer layer;

after depositing the at least one spacer layer, etching the nitride encapsulation layer and the at least one spacer layer as part of a single etch, the etching forming a first spacer and a first L-shaped gate encapsulation layer that is disposed on the sidewalls of the first gate stack in the nFET region and a second spacer and a second L-shaped gate encapsulation layer that is disposed on the sidewalls of the second gate stack in the pFET region, the first and second L-shaped gate encapsulation layers each comprising a vertical portion covering the sidewalls of the first, second, and third layers of the first and second gate stacks, respectively, and a horizontal portion covering a portion of the silicon layer that is adjacent to the first and second gate stacks, respectively, and each of the first and second spacers being above and in contact with the horizontal portion of the first and second L-shaped gate encapsulation layers, respectively, and adjacent to and in contact with the vertical portion of the first and second L-shaped gate encapsulation layers, respectively, each of the first and second spacers extending from the vertical portion of the first and second L-shaped gate encapsulation layers, respectively, to the horizontal portion of the first and second L-shaped gate encapsulation layers, respectively, each of the first and second spacers comprising a vertical sidewall extending from a surface of the horizontal portion of the first and second L-shaped gate encapsulation layers, respectively, to a height above at least the second layer comprising the metal or metal alloy, wherein etching the encapsulation layer and the at least one spacer layer further comprises
etching the first spacer layer and the second spacer layer so as to form the spacer, the spacer further comprising:
an L-shaped spacer layer that includes a vertical portion covering sidewalls of the vertical portion of the L-shaped gate encapsulation layer, and a horizontal portion covering the horizontal portion of the L-shaped gate encapsulation layer, where the L-shaped spacer layer is formed with a thickness that is less than a thickness of the L-shaped gate encapsulation layer; and
the second spacer layer disposed on sidewalls of the vertical portion of the L-shaped oxide layer and above the horizontal portion of the L-shaped oxide layer, wherein the L-shaped gate encapsulation layer, the L-shaped spacer layer, and the second spacer layer are formed with a combined width that is greater than a width of the gate stack;
after etching the nitride encapsulation layer and the at least one spacer layer, performing an extension implantation to implant ions so as to form source/drain extensions in the silicon layer, the source/drain extensions not underlying the first and second gate stacks; and
after performing the extension implantation, performing a source/drain implantation and performing an anneal to implant and diffuse ions for source and drain regions in the silicon layer,
wherein the extension implantation and the source/drain implantation are two separate implantations, and
both the extension implantation and the source/drain implantation are performed after etching the nitride encapsulation layer and the at least one spacer layer and while the first and second are present above the horizontal portion of the first and second L-shaped gate encapsulation layers, respectively, and adjacent to the vertical portion of the L-shaped gate encapsulation layers, respectively.

15. The non-transitory computer readable storage medium of claim 14, wherein a thickness of the first and second L-shaped gate encapsulation layers, respectively, is less than a thickness of the first layer of the gate stack.

16. The non-transitory computer readable storage medium of claim 14, wherein a thickness of the vertical portion of the first and second L-shaped gate encapsulation layers, respectively, is substantially equal to a thickness of the horizontal portion of the first and second L-shaped gate encapsulation layers, respectively.

17. The non-transitory computer readable storage medium of claim 14, wherein depositing the nitride encapsulation layer comprises performing molecular layer deposition (MLD), atomic layer deposition (ALD), low-pressure chemical vapor deposition (LPCVD), or rapid thermal chemical vapor deposition (RTCVD) to deposit a layer of nitride.

18. A method for fabricating a transistor, the method comprising:
providing a silicon layer above a substrate, the silicon layer being separated from the substrate by one or more layers;
forming a first layer on and in contact with the silicon layer, the first layer comprising a high dielectric constant material;
forming a second layer on and in contact with the first layer, the second layer comprising a metal or metal alloy;
forming a third layer on the second layer, the third layer comprising a conducting metal;
etching the first, second, and third layers so as to form first, second, and third layers of a gate stack;
depositing an encapsulation layer, the encapsulation layer including a horizontal portion in contact with the silicon layer and a vertical portion that is located on and in contact with sidewalls of the gate stack;
after depositing the encapsulation layer, depositing at least one spacer layer above and in contact with the horizontal portion of the encapsulation layer and adjacent to and in contact with the vertical portion of the encapsulation layer,
wherein depositing the one spacer layer comprises
depositing a first spacer layer above the horizontal portion of the encapsulation layer and adjacent to the vertical portion of the encapsulation layer, and
after depositing the first spacer layer, depositing a second spacer layer;
after depositing the at least one spacer layer, etching the nitride encapsulation layer and the at least one spacer layer so as to form a spacer and an L-shaped gate encapsulation layer that is disposed on the sidewalls of the gate stack, the L-shaped gate encapsulation layer comprising a vertical portion covering and in contact with the sidewalls of the first, second, and third layers of the gate stack and a horizontal portion covering and in contact with a portion of the silicon layer that is adjacent to the gate stack, and the spacer being above and in contact with the horizontal portion of the L-shaped gate encapsulation layer and adjacent to and in contact with the vertical portion of the L-shaped gate encapsulation layer, the spacer extending from the vertical portion of the L-shaped gate encapsulation layer to the horizontal portion of the L-shaped gate encapsulation layer, the spacer comprising a vertical sidewall extending from a surface of the horizontal portion of the L-shaped gate encapsulation layer to a height above at least the second layer comprising the metal or metal alloy,
wherein etching the encapsulation layer and the at least one spacer layer further comprises
etching the first spacer layer and the second spacer layer so as to form the spacer, the spacer further comprising:
an L-shaped spacer layer that includes a vertical portion covering sidewalls of the vertical portion of the L-shaped gate encapsulation layer, and a horizontal portion covering the horizontal portion of the L-shaped gate encapsulation layer, where the L-shaped spacer layer is formed with a thickness that is less than a thickness of the L-shaped gate encapsulation layer; and
the second spacer layer disposed on sidewalls of the vertical portion of the L-shaped oxide layer and above the horizontal portion of the L-shaped oxide layer, wherein the L-shaped gate encapsulation layer, the L-shaped spacer layer, and the second spacer layer are formed with a combined width that is greater than a width of the gate stack;
after etching the encapsulation layer and the at least one spacer layer, performing an extension implantation to implant ions so as to form source/drain extensions in the silicon layer, the source/drain extensions not underlying the gate stack; and
after performing the extension implantation, performing a source/drain implantation and performing an anneal to implant and diffuse ions for source and drain regions in the silicon layer, wherein the extension implantation and the source/drain implantation are two separate implantations, and both the extension implantation and the source/drain implantation are performed after etching the encapsulation layer and the at least one spacer layer and while the spacer is present above the horizontal portion of the L-shaped gate encapsulation layer and adjacent to the vertical portion of the L-shaped gate encapsulation layer.

19. The method of claim 18, wherein the third layer comprises tungsten or aluminum.

20. The method of claim 18, wherein the horizontal portion of the L-shaped gate encapsulation layer directly contacts the silicon layer.

* * * * *